United States Patent
Dupuis

(10) Patent No.: US 9,812,989 B1
(45) Date of Patent: Nov. 7, 2017

(54) ISOLATED POWER TRANSFER DEVICE

(71) Applicant: Silicon Laboratories Inc., Austin, TX (US)

(72) Inventor: Timothy J. Dupuis, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/270,470

(22) Filed: Sep. 20, 2016

(51) Int. Cl.
| | |
|---|---|
| *H02M 7/537* | (2006.01) |
| *H01L 23/498* | (2006.01) |
| *H01L 23/64* | (2006.01) |
| *H01L 23/00* | (2006.01) |
| *H01L 25/18* | (2006.01) |
| *H01L 23/66* | (2006.01) |
| *H01L 21/48* | (2006.01) |

(Continued)

(52) U.S. Cl.
CPC ............ *H02M 7/537* (2013.01); *G01R 19/18* (2013.01); *H01L 21/4853* (2013.01); *H01L 21/4857* (2013.01); *H01L 23/49822* (2013.01); *H01L 23/49844* (2013.01); *H01L 23/642* (2013.01); *H01L 23/645* (2013.01); *H01L 23/66* (2013.01); *H01L 24/48* (2013.01); *H01L 25/18* (2013.01); *H01L 25/50* (2013.01); *H03F 3/195* (2013.01); *H03F 3/213* (2013.01); *H01L 2223/665* (2013.01); *H01L 2223/6616* (2013.01); *H01L 2224/48227* (2013.01); *H01L 2924/14253* (2013.01); *H03F 2200/451* (2013.01)

(58) Field of Classification Search
CPC ...... H02M 7/003; H02M 7/217; H02M 7/537; H02M 7/575; H02M 3/33592; H02M 5/271; Y02B 70/1441; Y02B 70/1475; H01L 25/03; H02J 9/062

USPC .......................... 363/123, 127, 131, 147, 159
See application file for complete search history.

(56) References Cited

U.S. PATENT DOCUMENTS

| | | | |
|---|---|---|---|
| 7,489,526 B2 * | 2/2009 | Chen ................... | H02M 3/3374 363/17 |
| 7,679,162 B2 | 3/2010 | Dupuis et al. | |

(Continued)

OTHER PUBLICATIONS

Analog Devices, Inc., "Dual-Channel, 2.5 kV Isolators with Integrated DC-to-DC Converter," Data Sheet ADuM5200/ADuM5201/ADuM5202, 2009-2012, 28 pages.

(Continued)

*Primary Examiner* — Yemane Mehari
(74) *Attorney, Agent, or Firm* — Zagorin Cave LLP

(57) ABSTRACT

An isolated power transfer device includes a transformer formed in a multi-layer substrate of an integrated circuit package. A primary winding of the transformer is coupled to a first integrated circuit to form a DC/AC power converter and a secondary winding of the transformer is coupled to a second integrated circuit to form an AC/DC power converter. The first and second integrated circuits are electrically isolated from each other. The first integrated circuit includes a lightly doped drain MOSFET integrated with conventional CMOS devices and the second integrated circuit includes a Schottky diode integrated with conventional CMOS devices. The isolated power transfer device includes a capacitive channel for communication of information across an isolation barrier from the second integrated circuit to the first integrated circuit. Capacitors of the capacitive channel may be formed in the multi-layer substrate of the integrated circuit package.

20 Claims, 5 Drawing Sheets

(51) Int. Cl.
*H01L 25/00* (2006.01)
*H03F 3/195* (2006.01)
*H03F 3/213* (2006.01)
*G01R 19/18* (2006.01)

(56) References Cited

U.S. PATENT DOCUMENTS

| | | | |
|---|---|---|---|
| 7,706,154 | B2 | 4/2010 | Chen et al. |
| 8,861,229 | B2 * | 10/2014 | Alfano ............... H03K 17/691 323/299 |
| 2002/0150151 | A1 | 10/2002 | Krone et al. |
| 2003/0091140 | A1 | 5/2003 | Dupuis et al. |
| 2004/0057524 | A1 | 3/2004 | Krone et al. |
| 2004/0190670 | A1 | 9/2004 | Dupuis et al. |
| 2005/0100104 | A1 | 5/2005 | Dupuis et al. |
| 2007/0075813 | A1 | 4/2007 | Zhang |
| 2007/0080360 | A1 * | 4/2007 | Mirsky ............... H01L 23/3677 257/99 |
| 2007/0139032 | A1 | 6/2007 | Dupuis et al. |
| 2007/0246805 | A1 | 10/2007 | Zhang et al. |
| 2008/0013635 | A1 | 1/2008 | Dupuis |
| 2008/0025450 | A1 | 1/2008 | Alfano et al. |
| 2008/0031286 | A1 | 2/2008 | Alfano et al. |
| 2008/0119142 | A1 | 5/2008 | Dupuis |
| 2008/0260050 | A1 | 10/2008 | Dupuis |
| 2008/0267301 | A1 | 10/2008 | Alfano et al. |
| 2009/0017773 | A1 | 1/2009 | Dupuis et al. |
| 2010/0052826 | A1 | 3/2010 | Callahan et al. |
| 2010/0118918 | A1 | 5/2010 | Dupuis |
| 2015/0171901 | A1 | 6/2015 | Dupuis et al. |

OTHER PUBLICATIONS

Analog Devices, Inc., "Hot Swappable, Dual I2C Isolators with Integrated DC-to-DC Converter," Data Sheet ADM3260, 2013-2016, 19 pages.

Analog Devices, Inc., "Quad-Channel, 5 kV Isolators with Integrated DC-to-DC Converter," Data Sheet ADuM6400/ADuM6401/ADuM6402/ADuM6403/ADuM6404, 2009-2012, 28 pages.

Silicon Laboratories, "1MBPS, 2.5KVRMS Digital Isolators," Si86xx, 2015, 52 pages.

Silicon Laboratories, "5 KV LED Emulator Input, Open Collector Output Isolators," Si87xx, 2014, 39 pages.

* cited by examiner

ISOLATED POWER TRANSFER DEVICE

BACKGROUND

Field of the Invention

This invention relates to isolation technology and more particularly to providing power across an isolation barrier.

Description of the Related Art

An exemplary low power application (e.g., a system having a power level of approximately 1 W or less) may use a power converter that transfers power across an isolation barrier between systems having different voltage planes, (e.g., a voltage plane of a processor system and a voltage plane of a load system having a large DC or transient voltage difference between the voltage planes). Referring to FIG. 1, a conventional high-power system (e.g., a system having a power level greater than approximately 1 W) uses a power converter including standard transformer 102, e.g., a discrete transformer with a ferrite core and high efficiency to transfer power across the isolation barrier. Depending on the complexity of the drive circuitry, the conventional high power system may achieve power transfer efficiencies of approximately 70%-approximately 95%. Referring to FIG. 2, in order to regulate the output voltage, opto-isolator 204 or other communications technique provides any necessary feedback signals across the isolation barrier. Although the standard transformer implementation is efficient, the size and cost of the standard transformer implementation may be prohibitive for use in some applications. However, some low power applications tolerate lower efficiencies. Thus, low-cost, isolated power transfer systems having reasonable power transfer efficiency (e.g., power transfer efficiency greater than 40%) are desired.

SUMMARY OF EMBODIMENTS OF THE INVENTION

In at least one embodiment of the invention, an apparatus includes an integrated circuit package including a multi-layer substrate. The integrated circuit package includes a first conductive coil formed using the multi-layer substrate and a second conductive coil formed using the multi-layer substrate. The second conductive coil is inductively coupled to the first conductive coil and electrically isolated from the first conductive coil. The apparatus includes a first integrated circuit die held by the integrated circuit package and electrically coupled to the first conductive coil. The apparatus includes a second integrated circuit die held by the integrated circuit package. The second integrated circuit die is electrically coupled to the second conductive coil and electrically isolated from the first integrated circuit die. The first conductive coil is configured to transfer power via the second conductive coil from a first integrated circuit die held by the integrated circuit package to a second integrated circuit die held by the integrated circuit package. The first integrated circuit die may be coupled to the second integrated circuit die by an isolation channel to transfer information between the first integrated circuit die and the second integrated circuit die.

The first integrated circuit die may include a first pad coupled to a first terminal of the first conductive coil and a second pad coupled to a second terminal of the first conductive coil. The first integrated circuit die may include a third pad coupled to a second power supply node of the first integrated circuit die and a first circuit coupled to the first and second pads. The first conductive coil and the first circuit of the first integrated circuit die may form an oscillator circuit configured as a class AB RF power amplifier of a DC/AC power converter. The first integrated circuit die may include a first transistor of a first type and having a first breakdown voltage, a second transistor of the first type and having the first breakdown voltage, a first pad coupled to a first terminal of the first conductive coil and a first drain of the first transistor, and a second pad coupled to a second terminal of the first conductive coil and a second drain of the second transistor. The first integrated circuit die may further include circuitry coupled to the first and second transistors. The circuitry may include at least one transistor having a second breakdown voltage less than the first breakdown voltage.

The second integrated circuit die may include a first pad coupled to a first terminal of the second conductive coil, a second pad coupled to a second terminal of the second conductive coil, a first diode coupled between the first pad and a first power supply node, and a second diode coupled between the second pad and the first power supply node. The apparatus may include at least one capacitor formed using the multi-layer substrate and capacitively coupling the first integrated circuit die to the second integrated circuit die, the at least one capacitor being configured to transfer an information signal from the second integrated circuit die to the first integrated circuit die.

In at least one embodiment of the invention, a method for forming an isolated power transfer device includes forming a transformer using a multi-layer substrate of an integrated circuit package for holding a first integrated circuit die and a second integrated circuit die. The transformer is configured to transfer power from the first integrated circuit die to the second integrated circuit die. The first integrated circuit die is electrically isolated from the second integrated circuit die. The method includes electrically coupling the first integrated circuit die to a primary side of the transformer and electrically coupling the second integrated circuit die to a secondary side of the transformer.

Forming the transformer may include forming a first conductive coil using the multi-layer substrate and forming a second conductive coil using the multi-layer substrate. The second conductive coil may be inductively coupled to the first conductive coil and electrically isolated from the first conductive coil. The first conductive coil is configured to transfer power via the second conductive coil from the first integrated circuit die to the second integrated circuit die. The method may include forming a capacitor using the multi-layer substrate. The capacitor may be configured to transfer an information signal from the second integrated circuit die to the first integrated circuit die. The first integrated circuit die and the primary side of the transformer may form an oscillator circuit configured as a class AB RF power amplifier of a DC/AC power converter. The first integrated circuit die may include n-type lightly doped drain MOSFETS coupled between the primary side of the transformer and a first circuit comprising CMOS devices. The second integrated circuit die and the secondary side of the transformer may form an AC/DC power converter. The second integrated circuit die may include diodes coupled between the secondary side of the transformer and a second circuit comprising CMOS devices.

In at least one embodiment of the invention, an apparatus includes an integrated circuit package including a multi-layer substrate and at least one capacitor formed using the multi-layer substrate. The apparatus includes a first integrated circuit die held by the integrated circuit package and electrically coupled to the at least one capacitor. The apparatus includes a second integrated circuit die held by the integrated circuit package. The second integrated circuit die is electrically coupled to the at least one capacitor and electrically isolated from the first integrated circuit die. The at least one capacitor is configured to capacitively couple a first integrated circuit die held by the integrated circuit package to a second integrated circuit die held by the integrated circuit package. The at least one capacitor being configured to transfer an information signal from the second integrated circuit die to the first integrated circuit die. The integrated circuit package may include a transformer formed using the multi-layer substrate. The transformer may be configured to transfer power from the first integrated circuit die to the second integrated circuit die. The first integrated circuit die may include a first transistor of a first type and having a first breakdown voltage, a second transistor of the first type and having the first breakdown voltage, a first pad coupled to a primary side of the transformer and a first drain of the first transistor, a second pad coupled to the primary side of the transformer and a second drain of the second transistor, and circuitry coupled to the first and second transistors. The circuitry may include at least one transistor having a second breakdown voltage, the second breakdown voltage being less than the first breakdown voltage. The circuitry may be configured to enable an oscillator of a class AB RF power amplifier of a DC/AC power converter including the first and second transistors and the primary side of the transformer based on the information signal. The second integrated circuit die may include a first pad coupled to a secondary side of the transformer, a second pad coupled to the secondary side of the transformer, a first diode coupled between the first pad and a first power supply node, and a second diode coupled between the second pad and the first power supply node. The secondary side of the transformer and the first and second diodes may be configured in an AC/DC power converter. The monitor circuit configured to generate the information signal based on an output voltage of the AC/DC power converter.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A low-cost, isolated power transfer device includes a transformer formed in a multi-layer substrate of an integrated circuit package. A primary winding of the transformer is coupled to a first integrated circuit to form a DC/AC power converter and a secondary winding of the transformer is coupled to a second integrated circuit to form an AC/DC power converter. The first and second integrated circuits are electrically isolated from each other, i.e., no current flows between the first and second integrated circuits. The first integrated circuit includes a lightly doped drain MOSFET integrated with conventional CMOS devices and the second integrated circuit includes a Schottky diode integrated with conventional CMOS devices. The isolated power transfer device includes a capacitive channel for communication of feedback information across an isolation barrier from the second integrated circuit to the first integrated circuit. Capacitors of the capacitive channel may be formed in the multi-layer substrate of the integrated circuit package and electrically coupled to the first and second integrated circuits.

Figure 1:
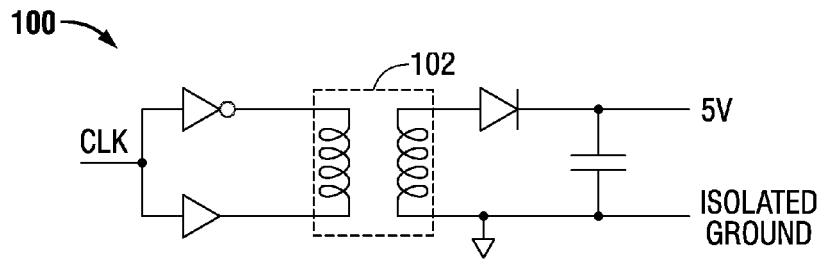
FIG. 1 illustrates a circuit diagram of a conventional circuit for transferring power across an isolation barrier.
Figure 2:
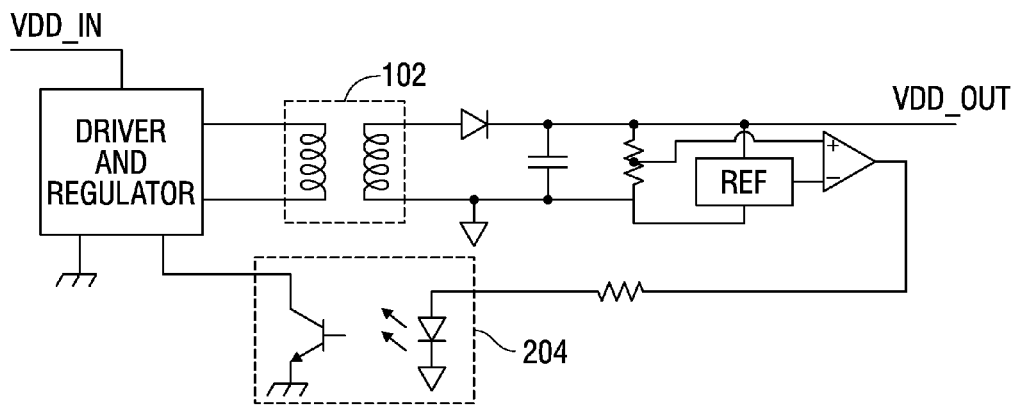
FIG. 2 illustrates a functional block diagram of a conventional system for transferring power across an isolation barrier using feedback to regulate the output voltage.
Figure 3:
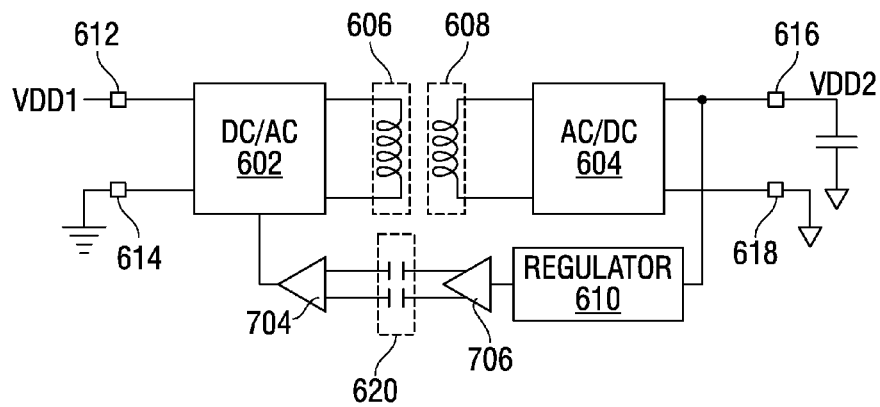
FIG. 3 illustrates a functional block diagram of a system for transferring power across an isolation barrier using feedback to regulate the output voltage.

Referring to FIG. 3, a power transfer device includes DC/AC power converter circuit 602, which uses input voltage $V_{DD1}$ received on pads 612 and 614, drives primary winding 606 of transformer 609, and AC/DC power converter circuit 604, which uses secondary winding 608 of transformer 609 to drive a target load that may be coupled to pads 616 and 618. The power transfer device regulates output voltage $V_{DD2}$ by turning on and off DC/AC power converter circuit 602 using feedback information received from voltage regulator 610 using capacitive channel 620 to couple electrically isolated integrated circuits. The feedback may be provided using transmitter 706 and receiver 704 that implement pulse frequency modulation or pulse width modulation control of capacitive channel 620, as described further below.

Figure 4:
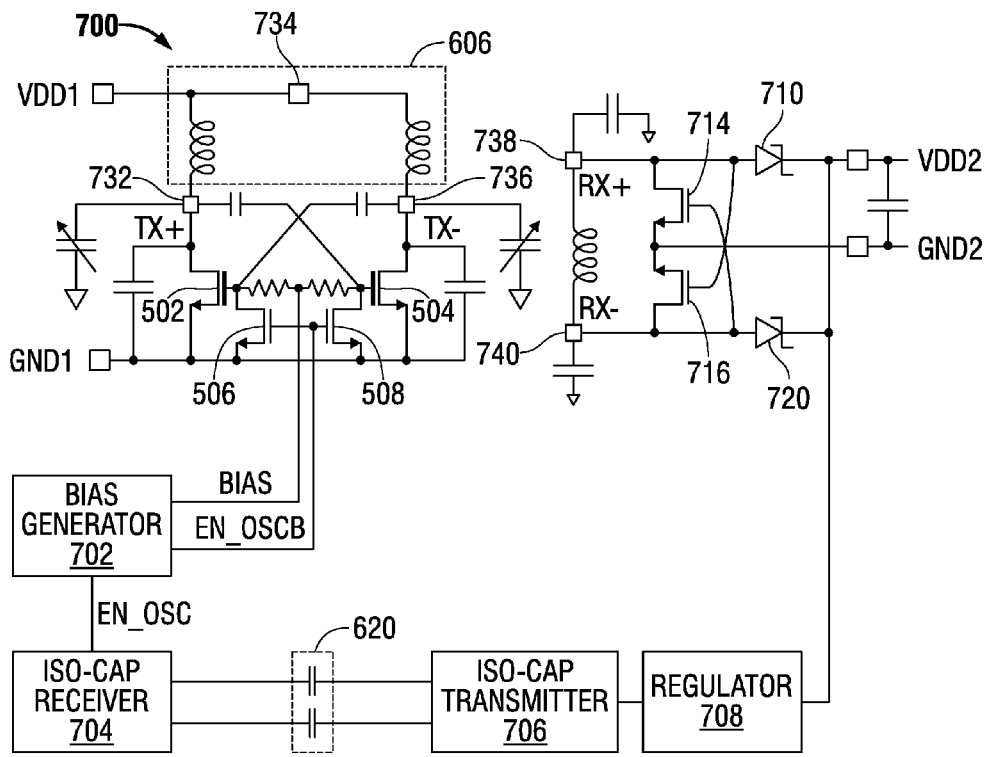
FIG. 4 illustrates a circuit diagram of an exemplary power transfer circuit consistent with at least one embodiment of the invention.
Figure 5:
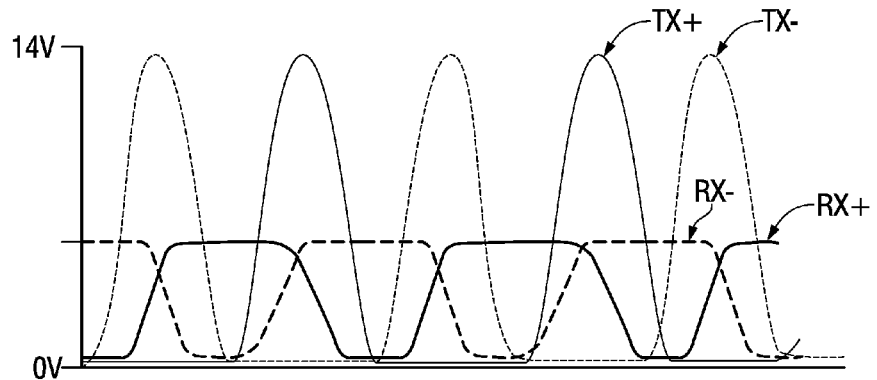
FIG. 5 illustrates exemplary transmit waveforms for the power transfer circuit of FIG. 4.

Referring to FIGS. 3, 4, and 5, in at least one embodiment, primary winding 606 and DC/AC power converter circuit 602 form an RF power amplifier oscillating stage configured to operate as a Class AB amplifier (i.e., an amplifier having $\pi < \alpha_0 < 2\pi$, where $\alpha_0$ is the conduction angle of the amplifier). Transistors 502 and 504 are biased such that each conducts during approximately one half of the cycle and do not conduct during the other half of the cycle. The RF power amplifier oscillating stage may be tuned to oscillate with a particular frequency, e.g., approximately 100 MHz-400 MHz, using variable capacitors.

In at least one embodiment, the RF power amplifier oscillating stage formed by primary winding 606 and DC/AC power converter circuit 602 is configured in deep Class AB operation (i.e., where $\alpha_0 = 1.2 \pi$), close to Class E, for high efficiency. Deep Class AB operation may cause the drains of transistors 502 and 504 to have peak voltage levels (e.g., 13 V) that approach $3 \times V_{DD1}$. Such voltage levels are not tolerated by conventional CMOS devices (e.g., conventional CMOS transistors operate up to $1.1 \times V_{DD1}$). Accordingly, transistor 502 and transistor 504 are lightly doped drain metal oxide semiconductor (LDMOS) transistors engineered for a high breakdown voltage. An exemplary LDMOS transistor can sustain high drain-to-source voltages. In at least one embodiment of the power transfer device, transistor 502 and transistor 504 are 16 V LDMOS n-type transistors, which are available in an exemplary manufacturing process for mixed-signal integrated circuits (e.g., bipolar-CMOS-DMOS manufacturing process). However, other transistors used by DC/AC power converter circuit 602 (e.g., transistors 506 and 508 and transistors in bias generator 702) may include conventional 5 V CMOS devices.

In at least one embodiment, in order to improve the efficiency of the power transfer device as compared to efficiency realized by conventional power transfer devices, AC/DC power converter circuit 604 includes Schottky diodes 710 and 712 integrated with conventional CMOS devices (e.g., cross-coupled n-type transistors 714 and 716, regulator 708, and transmitter 706). A Schottky diode (i.e., hot carrier diode) is a semiconductor diode formed by a junction of a semiconductor with a metal and is characterized to have a fast switching speed and low voltage drop. The Schottky diode can sustain high forward currents at lower voltage drops than would exist in typical diffused pn-junction diodes. An exemplary Schottky diode forward voltage is approximately 150 mV-450 mV, while a typical silicon diode has a forward voltage of approximately 600 mV-700 mV. The lower forward voltage requirement improves system efficiency. In general, Schottky diodes are not available in conventional CMOS manufacturing technologies because their manufacture requires additional mask layers and processing steps. However, Schottky diodes may be available with conventional CMOS devices in an exemplary mixed-signal integrated circuit manufacturing process (e.g., bipolar-CMOS-DMOS manufacturing process). Regulator 708, which is coupled to the Schottky diodes and monitors the output voltage $V_{DD2}$, and transmitter 706, which provides a digital signal to receiver 704 using capacitive channel 620, may be formed using conventional CMOS devices on the same integrated circuit. Regulator 708 may generate a pulse frequency modulated signal as the digital control signal or a pulse width modulated signal as the digital signal.

Figure 6:
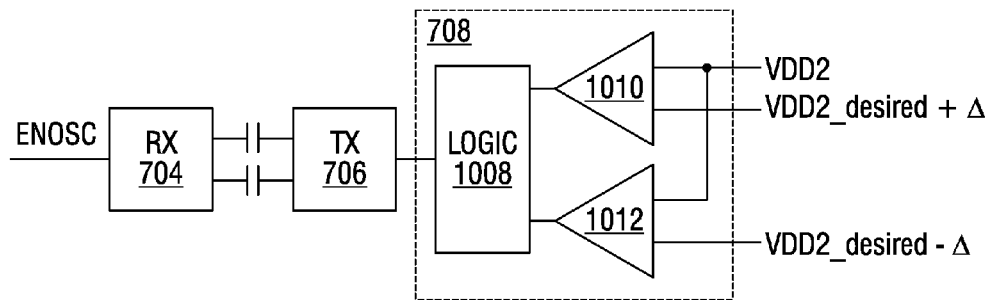
FIG. 6 illustrates a circuit diagram of an exemplary pulse frequency modulation regulator subsystem.

Referring to FIG. 6, in at least one embodiment, regulator 708 is configured for pulse frequency modulation control to convey information across the isolation barrier using capacitive channel 620. The digital control signal EN_OSCB, which is based on that information, is used to turn on DC/AC power converter circuit 602 when $V_{DD2}$ is less than a first target voltage (e.g., $V_{DD2\_TARGET} - V_A$) and turns off the power converter when $V_{DD2}$ is greater than a second target voltage (e.g., $V_{DD2\_TARGET} + V_A$). Hysteretic control implemented using comparator 1010 and comparator 1012 and logic 1008 may be fast and stable, may generate a signal having a ripple of approximately $2 \times V_A$, and may operate efficiently down to very low power levels. However, the frequency of the feedback signal varies as a function of the load current so this technique may cause emission or noise problems.

Figure 7:
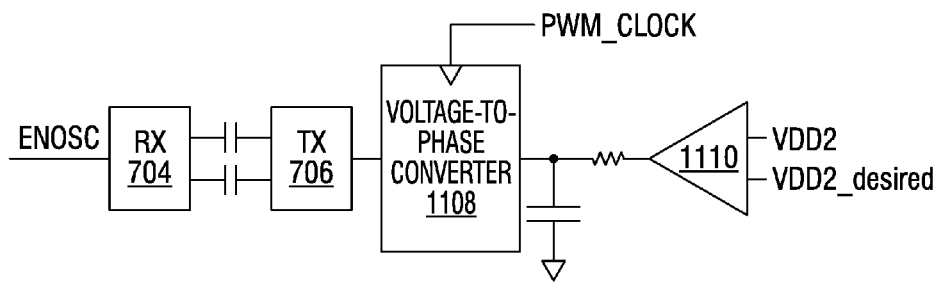
FIG. 7 illustrates a circuit diagram of an exemplary pulse width modulation regulator subsystem.

Referring to FIG. 7, in at least one embodiment, regulator 708 is configured for pulse width modulation control, which uses a fixed frequency and modulates the pulse width (or duty cycle) of the feedback signal according to the load. The compensation loop includes operational amplifier 1110, which compares the output voltage to a target voltage level, and pulse-width modulation converter 1108 generates the digital signal that is transmitted across the isolation barrier. This technique may use a loop filter to stabilize the compensation loop, making this technique slower than the pulse frequency modulation technique described above. Since pulse width modulation uses a fixed frequency signal, this technique may be preferable to the pulse frequency modulation in applications sensitive to emissions or noise. Embodiments of regulator 708 that use pulse width modulation control may be slower and more unstable than embodiments using pulse frequency modulation, but may ensure emissions are within a known frequency range. An exemplary power transfer device may provide both pulse width modulation control and pulse frequency modulation control and a user may select which technique is used by regulator 708 by bond wire selection or other suitable selection technique.

Figure 8:
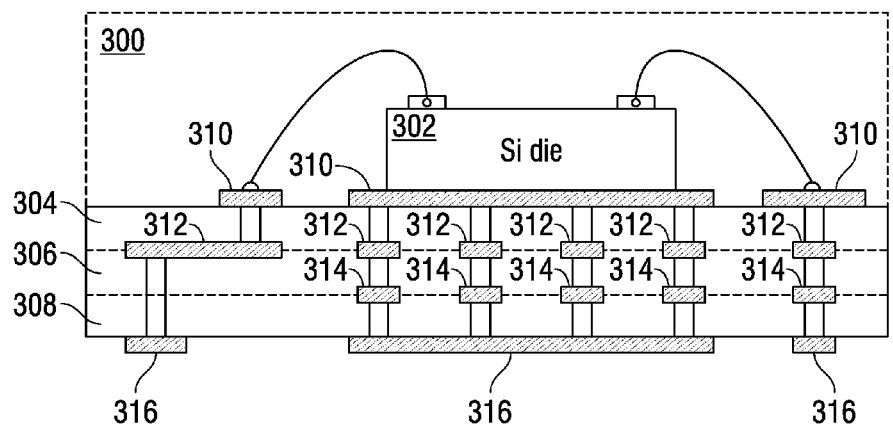
FIG. 8 illustrates a cross-sectional view of a conventional integrated circuit held in an integrated circuit package including a multi-layer substrate.

Referring to FIG. 8, an integrated circuit package includes a small substrate (e.g., printed circuit board) as part of the package. That substrate may include multiple conductive and insulating layers that are typically used to route signals between package terminals and one or more integrated circuits held by the package. For example, a Land Grid Array (LGA) package includes a multi-layer substrate including laminate layers 304, 306, and 308, and metal layers 310, 312, 314, and 316. Integrated circuit 302, which may be encapsulated using mold compound 300, is coupled to nodes in layer 310 using bond wires. Those nodes may be coupled to conductor pads in layer 316 using internal traces in metal layers 312 and 314 and conductive vias through the three layers of laminate.

Figure 9:
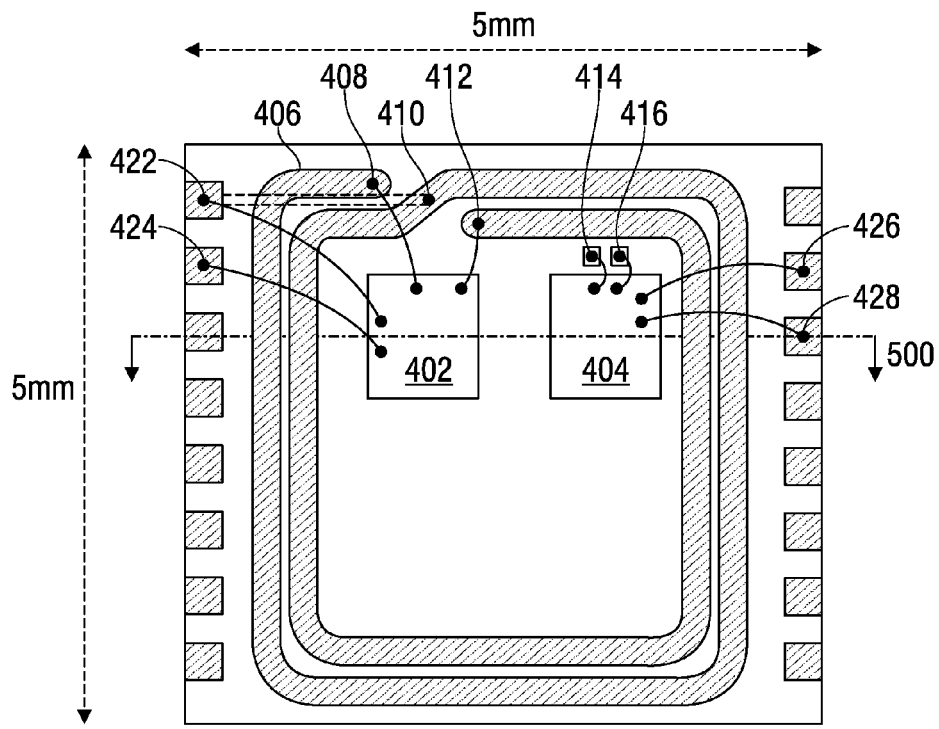
FIG. 9 illustrates a plan view of an integrated power transfer device consistent with at least one embodiment of the invention.
Figure 10:
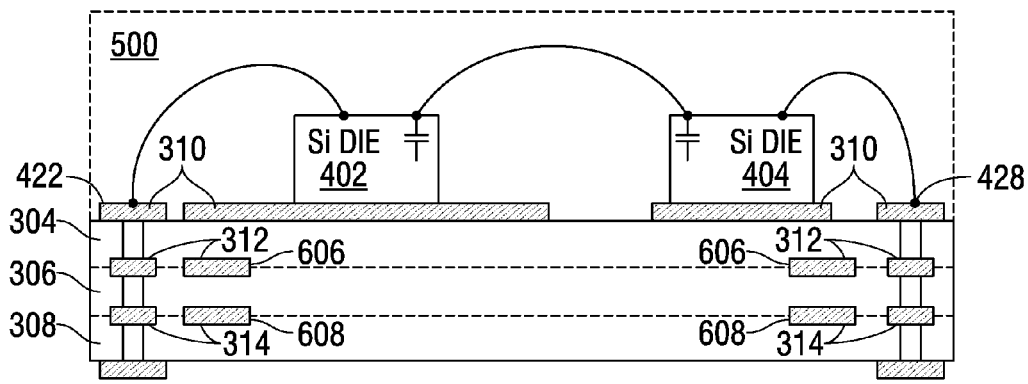
FIG. 10 illustrates a cross-sectional view of the integrated power transfer device of FIG. 9.

Referring to FIGS. 4, 9, and 10, conductive traces formed using portions of metal layers 312 and 314 that are surrounded by the laminate layers 304, 306, and 308 of the multi-layer substrate of an integrated circuit package, may be used to form the transformer (e.g., a transformer without a ferrite core) of the power transfer device. For example, primary winding 606 may be formed using metal layer 312 to generate coil 406 and secondary winding 608 may be formed using metal layer 314 to generate a coil in layers separate from layers including conductive coil 406. In general, dimensions of the coils forming the transformer are determined by the thickness of the conductor layer in the multi-layer substrate and may be formed to fit an area defined by the package size, rather than defined by a size of a substrate used to form an integrated circuit (e.g., left-side die 402 or the right-side die 404) held by the package. Left-side die 402 and right-side die 404 are completely electrically isolated from each other (e.g., using mold compound and separate power planes), but in some applications, a capacitive communications channel is used to transfer information between the two integrated circuit dies. Left-side die 402 is coupled to a first terminal, a center tap, and a second terminal of conductive coil 406 using bond wires that couple pads 732 and 736 to contacts 408 and 412, respectively. Contact 410 couples a center tap of the conductive coil to a power supply pin of the package, e.g., using a conductive line in the same or different conductive layer of the multi-layer substrate (as indicated by the dashed lines). However, in other embodiments, contact 410 couples the center tap of the conductive coil using a bond wire to a power supply pin of left-side die 402, which is then coupled to a power supply pin of the package using another bond wire, or other suitable technique. Right-side die 404 is coupled to a first terminal and a second terminal of a conductive coil forming secondary winding 608 using pads 738 and 740 and contacts 414 and 416. Left-side die 402 and right-side die 404 may be coupled to separate power supply nodes using bond wires coupled to terminals 422 and 424 and to terminals 426 and 428, respectively.

In at least one embodiment of the multi-layer substrate, the insulating material is Barium Titanate (BT) or FR4 (i.e. a fiberglass reinforced epoxy laminate). Barium Titanate is similar to FR4 but has improved isolation strength and thermal properties. Since most of the package area may be used for the transformer, a larger, high Q inductance may be achieved than for a transformer formed as part of an integrated circuit die held by the package. The greater inductance may improve efficiency of the power transfer device as compared to power transfer solutions that use conventional integrated circuit transformers, which typically have efficiencies of approximately 30%.

Referring to FIGS. 4 and 10, in at least one embodiment of a power transfer device, conductive traces formed using portions of metal layers of the multi-layer substrate of an integrated circuit package, are used to form capacitors of capacitive channel 620. For example, a first plate of a parallel plate capacitor may be formed using metal layer 310 and a second plate of the parallel plate capacitor may be formed using metal layer 314. The parallel plates of the capacitors may be coupled to left-side die 402 and right-side die 404 using bond wires, pads, and conductive traces and conductive vias in the multi-layer substrate.

Figure 11:
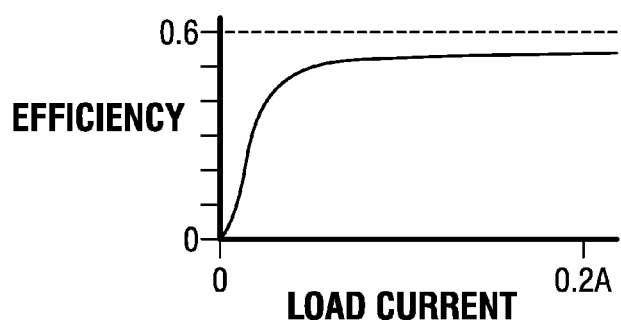
FIG. 11 illustrates efficiency as a function of load current for an integrated power transfer device consistent with at least one embodiment of the invention.

Referring to FIG. 11, embodiments of a power transfer device disclosed herein provide power conversion with constant efficiency as a function of the load (e.g., efficiency of approximately 60%) at output power levels of greater than 1 W. In at least one embodiment, a power transfer device including a transformer formed in a multi-layer substrate of an integrated circuit package receives input voltage $V_{DD1}$ of 5 V and provides an output voltage $V_{DD2}$ of 5 V. Simulation indicates a corresponding input power of approximately 2.2 W and a corresponding output power of approximately 1.28 W. Accordingly, the simulated efficiency is approximately 58%. In a lower power embodiment, the power transfer device receives input voltage $V_{DD1}$ of 3.3 V and provides output voltage $V_{DD2}$ of 3.3 V. Simulation indicates a corresponding input power of approximately 1.4 W and corresponding output power of approximately 0.66 W. Accordingly, the simulated efficiency is approximately 43%.

An exemplary substrate transformer is formed using a 5×5 mm multi-layer substrate of a laminate package using two separate coils electrically isolated from each other. Each of the two coils is a planar, spiral inductor formed in a separate conductive layer of the multi-layer substrate of the package using conductors having line widths of approximately 150 μm and approximately 20-30 μm thick and isolated by insulating material. In at least one embodiment, the insulating material is a BT resin having exemplary thicknesses in the range of 0.04 mm to 0.2 mm, exemplary Breakdown Voltage in the range of 6.0 kV to 15.2 kV, exemplary dielectric strength in the range of 69 kV/mm to 150 kV/mm, and thermal conductivity on the order of 0.8 W/mK, as compared to silicon having a thermal conductivity of 1.2 W/mK. The isolation provided by the insulating material is determined by the thickness of the insulating material. A standard 60 μm thickness for BT resin may provide a breakdown voltage of greater than approximately 5000 V. Thicker laminates may provide higher breakdown voltages. A first coil forming the primary winding of the transformer is coupled to at least three pads for the input terminal, output terminal, and a center tap terminal. A second coil forms the secondary winding of the transformer and is coupled to at least two pads for the input terminal and the output terminal.

Figure 12:
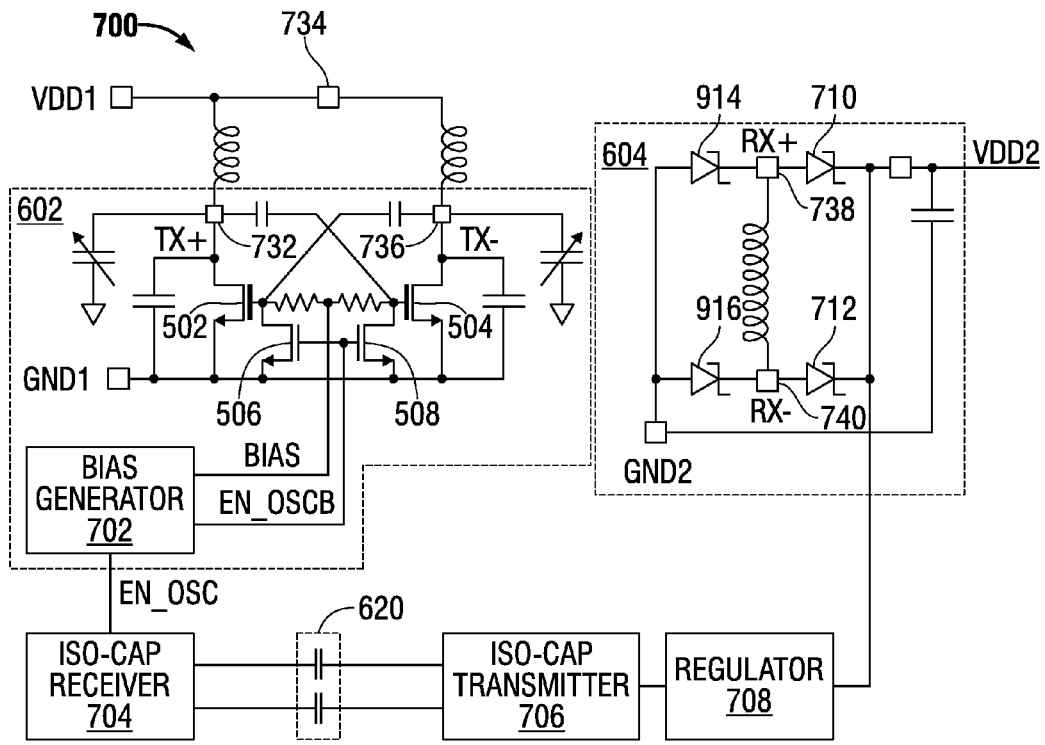
FIG. 12 illustrates a circuit diagram of an exemplary power transfer circuit consistent with at least one embodiment of the invention.

Referring to FIG. 12, in at least one embodiment, a power transfer device is intended for a gate driver application having an input voltage of 5 V and a load requiring an output voltage of 10 V. In the gate driver application, the transmit oscillator of DC/AC power converter circuit 602 is tuned to a different frequency (e.g., 150 MHz) than in the power transfer device described above. In addition, cross-coupled transistors 714 and 716 of FIG. 4 are replaced with additional Schottky diodes 914 and 916 in AC/DC power converter circuit 604 of FIG. 12. In at least one embodiment, when input voltage $V_{DD1}$ is 5 V, output voltage $V_{DD2}$ is 10 V, simulations indicate input power of approximately 1.03 W and output power of approximately 0.75 W. This power level can switch a 10 nF load to 10 V at a frequency of 750 kHz or a 1 nF load to 10 V at a frequency of 7.5 MHz. Accordingly, the simulated efficiency is approximately 73%.

Figure 13:
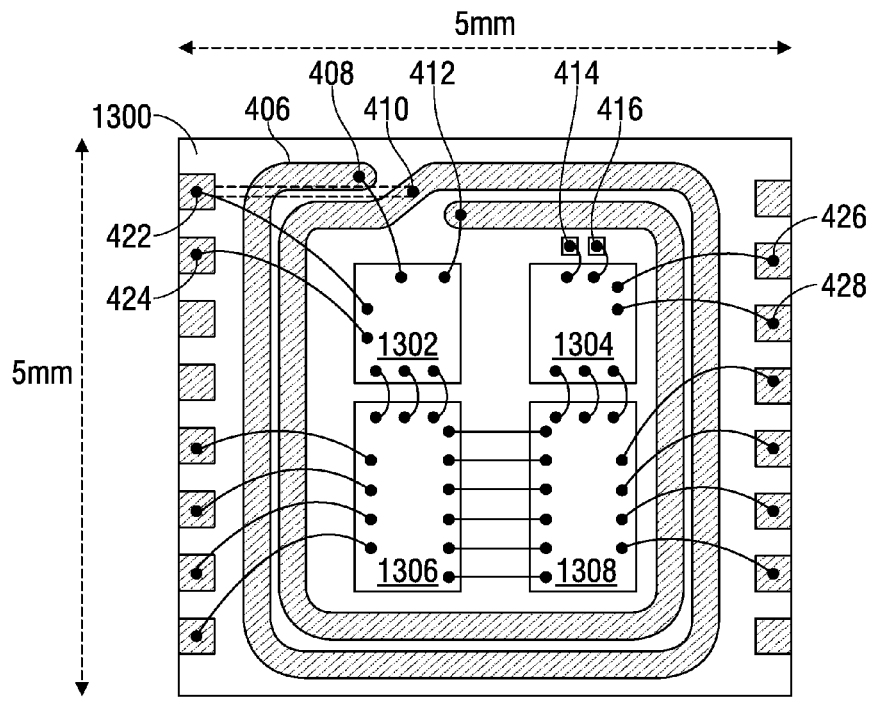
FIG. 13 illustrates a plan view of an integrated power transfer device consistent with at least one embodiment of the invention.

Although techniques described herein are described with respect to a power transfer device, techniques described herein may be combined with other isolated products, e.g., digital isolators, analog isolators, and gate drivers in the same package in order to eliminate the need for an isolated power supply. For example, referring to FIG. 13, package 1300 includes a transformer formed in a multi-layer substrate of the package and holds integrated circuit die 1302 including DC/AC power converter circuit 602, integrated circuit die 1304 including AC/DC power converter circuit 604. Integrated circuit die 1302 and integrated circuit die 1304 are coupled to other isolated products (e.g., integrated circuit die 1306 and integrated circuit die 1308) of integrated circuits held by the package that would otherwise require an isolated power supply.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in an embodiment in which the transformer is formed from coils having a 1:1 ratio, two turns each, and a planar spiral structure, one of skill in the art will appreciate that the teachings herein can be utilized with other transformers using other turn ratios, other numbers of turns per coil (e.g., n turns per coil, where n is an integer greater than one or a fraction less than one), or other physical designs. Variations and modifications of the embodiments disclosed herein, may be made based on the description set forth herein, without departing from the scope of the invention as set forth in the following claims.

What is claimed is:

1. An apparatus comprising:
   an integrated circuit package comprising:
   a multi-layer substrate;
   a first conductive coil formed using the multi-layer substrate; and
   a second conductive coil formed using the multi-layer substrate, the second conductive coil being inductively coupled to the first conductive coil and electrically isolated from the first conductive coil;
   a first integrated circuit die held by the integrated circuit package and electrically coupled to the first conductive coil; and
   a second integrated circuit die held by the integrated circuit package, the second integrated circuit die being electrically coupled to the second conductive coil and electrically isolated from the first integrated circuit die,
   wherein the first conductive coil is configured to transfer power via the second conductive coil from the first integrated circuit die to the second integrated circuit die.

2. The apparatus, as recited in claim 1, wherein the first integrated circuit die is coupled to the second integrated circuit die by an isolation channel to transfer information between the first integrated circuit die and the second integrated circuit die.

3. The apparatus, as recited in claim 1, wherein the first integrated circuit die comprises:
   a first pad coupled to a first terminal of the first conductive coil; and
   a second pad coupled to a second terminal of the first conductive coil.

4. The apparatus, as recited in claim 3, wherein the first integrated circuit die comprises:
   a third pad coupled to a second power supply node of the first integrated circuit die; and
   a first circuit coupled to the first and second pads,
   wherein the first conductive coil and the first circuit of the first integrated circuit die form an oscillator circuit configured as a class AB RF power amplifier of a DC/AC power converter.

5. The apparatus, as recited in claim 1, wherein the first integrated circuit die comprises:
   a first transistor of a first type and having a first breakdown voltage;
   a second transistor of the first type and having the first breakdown voltage;
   a first pad coupled to a first terminal of the first conductive coil and a first drain terminal of the first transistor; and
   a second pad coupled to a second terminal of the first conductive coil and a second drain terminal of the second transistor.

6. The apparatus, as recited in claim 5, wherein the first integrated circuit die further comprises:
   circuitry coupled to the first and second transistors, the circuitry including at least one transistor having a second breakdown voltage, the second breakdown voltage being less than the first breakdown voltage.

7. The apparatus, as recited in claim 1, wherein the second integrated circuit die comprises:
   a first pad coupled to a first terminal of the second conductive coil;
   a second pad coupled to a second terminal of the second conductive coil;
   a first diode coupled between the first pad and a first power supply node; and
   a second diode coupled between the second pad and the first power supply node.

8. The apparatus, as recited in claim 7, wherein the second integrated circuit die comprises:
   a third diode coupled between the first pad and a second power supply node; and
   a fourth diode coupled between the second pad and the second power supply node.

9. The apparatus, as recited in claim 7, wherein the second integrated circuit die comprises:
   a first transistor having a first drain terminal coupled to the first pad, a first gate terminal coupled to the second pad, and a first source terminal coupled to a second power supply node; and
   a second transistor having a second drain terminal coupled to the second pad, a second gate terminal coupled to the first pad, and a second source terminal coupled to the second power supply node.

10. The apparatus, as recited in claim 1, further comprising:
    at least one capacitor formed using the multi-layer substrate and capacitively coupling the first integrated circuit die to the second integrated circuit die, the at least one capacitor being configured to transfer an information signal from the second integrated circuit die to the first integrated circuit die.

11. The apparatus, as recited in claim 10,
    wherein the first integrated circuit die comprises:
    a first transistor of a first type and having a first breakdown voltage;
    a second transistor of the first type and having the first breakdown voltage;
    a first pad coupled to a first terminal of the first conductive coil and a first drain terminal of the first transistor;
    a second pad coupled to a second terminal of the first conductive coil and a second drain terminal of the second transistor; and
    circuitry configured to enable an oscillator circuit configured as a class AB RF power amplifier of a DC/AC power converter based on the information signal, the circuitry including transistors having a second breakdown voltage less than the first breakdown voltage, and
    wherein the second integrated circuit die comprises:
    a third pad coupled to a first terminal of the second conductive coil;
    a fourth pad coupled to a second terminal of the second conductive coil;
    a first diode coupled between the third pad and a second power supply node;
    a second diode coupled between the fourth pad and the second power supply node, and
    a monitor circuit configured to generate the information signal based on an output voltage of the first and second diodes.

12. The apparatus, as recited in claim 1, wherein the first conductive coil is formed using a first conductive layer of the multi-layer substrate and the second conductive coil is formed using a second conductive layer of the multi-layer substrate.

13. A method for forming an isolated power transfer device comprising:
    forming a transformer using a multi-layer substrate of an integrated circuit package for holding a first integrated circuit die and a second integrated circuit die, the transformer being configured to transfer power from the first integrated circuit die to the second integrated circuit die, the first integrated circuit die being electrically isolated from the second integrated circuit die;

electrically coupling the first integrated circuit die to a primary side of the transformer; and electrically coupling the second integrated circuit die to a secondary side of the transformer.

14. The method, as recited in claim 13, wherein forming the transformer comprises:

forming a first conductive coil using the multi-layer substrate; and forming a second conductive coil using the multi-layer substrate, the second conductive coil being inductively coupled to the first conductive coil and electrically isolated from the first conductive coil, the first conductive coil being configured to transfer power via the second conductive coil from the first integrated circuit die to the second integrated circuit die.

15. The method, as recited in claim 13, further comprising:

forming a capacitor using the multi-layer substrate, the capacitor being configured to transfer an information signal from the second integrated circuit die to the first integrated circuit die.

16. The method, as recited in claim 13, wherein the electrically coupling the first integrated circuit die to the primary side of the transformer forms an oscillator circuit configured as a class AB RF power amplifier of a DC/AC power converter, the first integrated circuit die including n-type lightly doped drain MOSFETS coupled between the primary side of the transformer and a first circuit comprising CMOS devices; and wherein the electrically coupling the second integrated circuit die to the secondary side of the transformer forms an AC/DC power converter, the second integrated circuit die including diodes coupled between the secondary side of the transformer and a second circuit comprising CMOS devices.

17. An apparatus comprising:
an integrated circuit package comprising:
a multi-layer substrate;
at least one capacitor formed using the multi-layer substrate,
a first integrated circuit die held by the integrated circuit package and electrically coupled to the at least one capacitor; and second integrated circuit die held by the integrated circuit package, the second integrated circuit die being electrically coupled to the at least one capacitor and electrically isolated from the first integrated circuit die, wherein the at least one capacitor is configured to transfer an information signal from the second integrated circuit die to the first integrated circuit die.

18. The apparatus, as recited in claim 17, wherein the integrated circuit package further comprises:

a transformer formed using the multi-layer substrate, the transformer being configured to transfer power from the first integrated circuit die to the second integrated circuit die.

19. The apparatus, as recited in claim 18, wherein the first integrated circuit die comprises:

a first transistor of a first type and having a first breakdown voltage;

a second transistor of the first type and having the first breakdown voltage;

a first pad coupled to a primary side of the transformer and a first drain terminal of the first transistor;

a second pad coupled to the primary side of the transformer and a second drain terminal of the second transistor; and circuitry coupled to the first and second transistors, the circuitry including at least one transistor having a second breakdown voltage, the second breakdown voltage being less than the first breakdown voltage, the circuitry being configured to enable an oscillator of a class AB RF power amplifier of a DC/AC power converter including the first and second transistors and the primary side of the transformer based on the information signal.

20. The apparatus, as recited in claim 18, wherein the second integrated circuit die comprises:

a first pad coupled to a secondary side of the transformer;

a second pad coupled to the secondary side of the transformer;

a first diode coupled between the first pad and a first power supply node;

a second diode coupled between the second pad and the first power supply node, the secondary side of the transformer and the first and second diodes being configured in an AC/DC power converter; and a monitor circuit configured to generate the information signal based on an output voltage of the AC/DC power converter.

* * * * *